(12) United States Patent
Bergogne et al.

(10) Patent No.: US 11,601,125 B2
(45) Date of Patent: Mar. 7, 2023

(54) SWITCH CONTROL DEVICE

(71) Applicant: Commissariat à l'Energie Atomique et aux Energies Alternatives, Paris (FR)

(72) Inventors: Dominique Bergogne, Grenoble (FR); Thanh-Hai Phung, Grenoble (FR)

(73) Assignee: Commissariat à l'Energie Atomique et aux Energies Alternatives, Paris (FR)

(*) Notice: Subject to any disclaimer, the term of this patent is extended or adjusted under 35 U.S.C. 154(b) by 35 days.

(21) Appl. No.: 17/303,792

(22) Filed: Jun. 8, 2021

(65) Prior Publication Data

US 2021/0384902 A1 Dec. 9, 2021

(30) Foreign Application Priority Data

Jun. 9, 2020 (FR) ...................................... 2006028

(51) Int. Cl.
*H03K 17/687* (2006.01)
*H03K 17/041* (2006.01)
*H03K 17/284* (2006.01)

(52) U.S. Cl.
CPC ... *H03K 17/6871* (2013.01); *H03K 17/04106* (2013.01); *H03K 17/284* (2013.01)

(58) Field of Classification Search
CPC ......... H03K 17/6871; H03K 17/04106; H03K 17/284
See application file for complete search history.

(56) References Cited

U.S. PATENT DOCUMENTS

| 7,755,400 B2* | 7/2010 | Jordanger ........... H04L 25/4902 327/531 |
| 7,777,370 B2* | 8/2010 | Kojori ................ H03K 17/0406 307/127 |
| 9,467,060 B2* | 10/2016 | Boezen .......... H03K 19/018521 |
| 2016/0043072 A1* | 2/2016 | Vielemeyer ........ H03K 17/6871 327/109 |
| 2016/0248413 A1 | 8/2016 | Tabata et al. |

FOREIGN PATENT DOCUMENTS

DE 29503129 U1 4/1995

OTHER PUBLICATIONS

Preliminary Search Report for French Application No. 2006028 dated Jan. 26, 2021, 2 pages.

\* cited by examiner

*Primary Examiner* — Colleen J O Toole
(74) *Attorney, Agent, or Firm* — Moreno IP Law LLC

(57) ABSTRACT

The present description concerns a method of controlling at least one switch (TH), including: the reception of signals (S3-i) having between one another at least one phase shift representative of a desired state of said at least one switch; the obtaining, from said signals, of a value (Si) representative of the desired state; and the application of the representative value to said at least one switch.

19 Claims, 6 Drawing Sheets

SWITCH CONTROL DEVICE

FIELD

The present disclosure generally concerns electronic devices, particularly the control of switches, more particularly the control of switched-mode converter switches.

BACKGROUND

Controlled switches are used, in particular, in switched-mode converters. The switches are alternately set to the on and off states at a switching frequency. Switched-mode converters are used to deliver a voltage and/or a current, from a power supply having voltage/current values different from the values of the voltage/current to be delivered. For example, an AC/DC (alternating current-direct current) switched-mode converter enables to obtain a DC voltage from an AC voltage such as that of an electric network or of an alternator.

Document US-A-2016/0248413 describes a close control device or driver.

Document DE-U-29503129.8 describes a circuit layout to power on and off a DC current charge circuit by means of field-effect transistors.

SUMMARY

There is a need to increase the reliability of known switched-mode converters.

There is a need to deliver a power supply voltage to a circuit applying control signals to a switch of a switched-mode converter.

There is a need to control a plurality of switches having potentials variable with respect to one another.

An embodiment overcomes all or part of the disadvantages of known switched-mode converters.

An embodiment overcomes all or part of the disadvantages of known methods of controlling switches, particularly switched-mode converter switches.

An embodiment overcomes all or part of the disadvantages of known circuits for controlling switches, particularly switched-mode converter switches.

An embodiment provides accelerating the switching speed applicable to a switch by a known control circuit, in particular in a switched-mode converter.

An embodiment provides accelerating the switching frequency and/or increasing the reliability level of known switched-mode converters.

An embodiment provides a method of controlling at least one switch, comprising:

the delivery, by a transmitter module and from a first square pulse signal, representative of the desired state of said switch and having cycles repeated at a switching frequency, of second square pulse signals all having a same frequency, greater than the switching frequency, said second signals having with respect to one another at least one phase shift having a value which is a function of the state of the first signal;

the transmission of said second signals through capacitive elements delivering phase-shifted signals;

the reception, by a receiver module, of the phase-shifted signals reproducing said at least one phase shift;

the verification, by the receiver module, of a valid or invalid state of said at least one phase shift;

the obtaining and the storage, when the state of said at least one phase shift is valid, of a value from said phase-shifted signals, said value being representative of the desired state of said at least one switch; and the application, to said at least one switch, of the obtained representative value if the state of said at least one phase-shift is valid or of the stored representative value if the state of said at least one phase shift is invalid.

According to an embodiment, said transmitter module is referenced to a first potential, said receiver module being referenced to a second potential variable with respect to the first potential.

According to an embodiment, the second potential is a reference potential for controlling said at least one switch.

According to an embodiment, a generator of a voltage uses an energy conveyed by said signals, the generator preferably comprising a rectifying circuit.

According to an embodiment, the transmitter module is powered with said voltage.

According to an embodiment, the generator comprises a clipping circuit, preferably comprising one or a plurality of Zener diodes and/or one of a plurality of transistors controlled by dividing bridges receiving said signals.

An embodiment provides a circuit for controlling at least one switch comprising:

at least one driver of application, to a control terminal of said at least switch, of a square pulse control signal having cycles repeated at a switching frequency; and a module for receiving phase-shifted square pulse signals, representative of a desired state of said at least one switch, the frequency of the cycles of said phase-shifted signals being greater than the switching frequency and at least one phase shift between said phase-shifted signals having a different value according to the desired state of said at least one switch, the receiver module delivering, to said driver, a value corresponding to a value obtained and stored from said at least one phase shift when the state of said at least one phase shift is valid and to a stored value if the state of said at least one phase shift is invalid.

According to an embodiment, the circuit comprises a generator of a voltage from an energy conveyed by said phase-shifted signals, the generator comprising a circuit for clipping said phase-shifted signals.

According to an embodiment, the circuit comprises two logic gates, each carrying out an XOR-type function, comparing a first phase-shifted signal respectively with a second and a third phase-shifted signal, the valid or non-valid state of said at least one phase shift being determined according to the result of the comparisons.

According to an embodiment, the circuit further comprises:

a first and a second flip-flop having data inputs respectively receiving said second and third phase-shifted signals and clock inputs receiving the respective results of the comparisons performed by said logic gates; and a third flip-flop for delivering said value representative of the desired state of said at least one switch, the third flip-flop having a clock input coupled to an output of the second flip-flop and a data input coupled to an output of the third flip-flop.

An embodiment provides a system for controlling at least one switch comprising:

a transmitter module for delivering, from a first square pulse signal representative of the desired state of said switch and having cycles repeated at a switching frequency, second square pulse signals all having a same frequency, greater than the switching frequency, said second signals having with respect to one another at least one phase shift having a different value according to the state of the first signal;

a circuit for controlling said switch such as described; and capacitive elements of transmission of said second signals to said control circuit in the form of said phase-shifted signals.

According to an embodiment, the system is configured to implement the described method.

An embodiment provides a device comprising a system such as defined hereabove and said at least one switch, said at least one switch being preferably of HEMT type, more preferably with GaN.

An embodiment provides a monolithic device comprising a circuit such as defined hereabove or a device such as defined hereabove.

An embodiment provides a switched-mode converter comprising one or a plurality of systems such as defined hereabove, and/or one or a plurality of devices such as defined hereabove.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the switched-mode converter structures and the methods of generation of signals representative of desired states of switched-mode converter switches are not described in detail, the embodiment being compatible with all or most of usual switched-mode converters.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
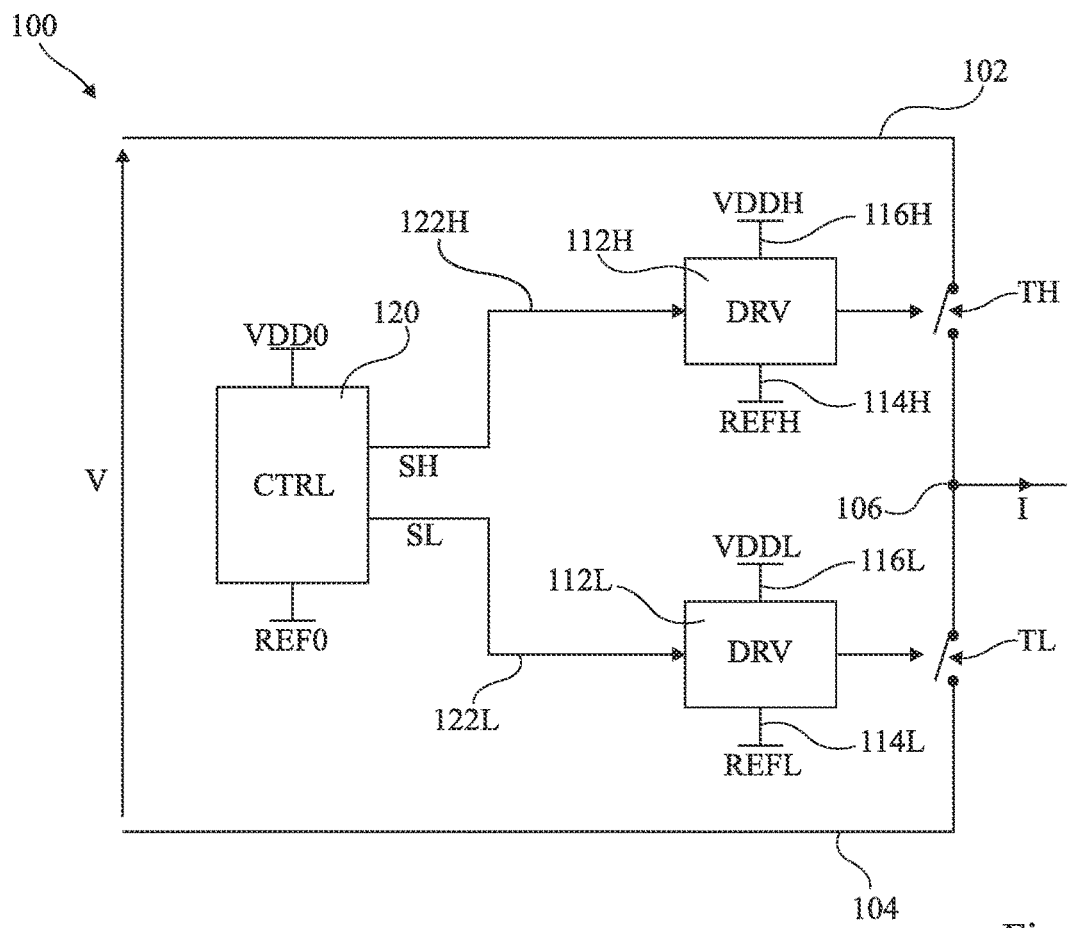
FIG. 1 schematically shows an example of a switching cell of a converter of a type to which the described embodiments apply.

FIG. 1 schematically shows an example of a switching cell 100 of a converter of a type to which the described embodiments apply.

Switching cell 100 comprises the association of two switches TH and TL electrically in series between nodes 102 and 104. Switches TH and TL are controlled so that, when one of switches TH and TL is on, the other of switches TH and TL is off. Thus, switches TH and TL are not simultaneously on. Switches TH and TL may also be simultaneously off. Each of switches TH and TL is on in turn, thus defining switchings between an on state of one of switches TH and TL, and an on state of the other one of switches TH and TL.

Switches TH and TL typically comprise field-effect transistors. Each switch TH, TL may comprise or be formed by a transistor or a plurality of transistors in series and/or in parallel. This switch then has source and drain terminals respectively corresponding to source and drain terminals of the transistor(s). Each switch TH, TL has a control terminal defined, in the case of switches comprising one or more transistors, by a gate terminal of the transistor(s). The on/off state of the switch is obtained by applying a voltage between the control terminal and a reference terminal of the switch, for example, a source or drain terminal. In other words, a voltage referenced to the potential of the reference terminal is applied to the control terminal.

Preferably, switches TH and TL are of HEMT type, that is, they comprise transistors of the type called high electron mobility transistor HEMT. This type of transistor achieves, in its on state, a conduction between drain and source by an interface between wide bandgap semiconductors, the electrons being mobile along said interface. These semiconductors may be gallium nitride GaN and aluminum gallium nitride AlGaN. It is then spoken of a GaN HEMT-type transistor. HEMT transistors enable to block higher voltages and enable faster switchings than other types of field-effect transistors.

The converter where switching cell 100 is located receives or delivers a voltage V. The converter receives or delivers a current I on a node 106 of series connection of switches TH and TL. Current I is received or delivered by elements, not shown, of the converter. Current I is for example in an inductance, not show, internal to the converter. The structure of the converter is not detailed herein, the described embodiments being compatible with usual switched-mode converters.

In a typical application, voltage V is an AC voltage originating from an electric distribution network. Voltage V then for example has a rms. voltage in the order of approximately 110 V or of approximately 230 V, and for example a frequency equal to 50 HZ or 60 Hz. The converter delivers a DC voltage, obtained from current I by portions, not shown, of the converter. The DC voltage is typically used to charge a battery, for example, a battery of a laptop computer or of a mobile distant communication device such as a cell phone. More particularly, the battery charge may be performed via a connection of universal serial bus USB type, preferably with a power delivery.

Signals SH and SL for controlling respective switches TH and TL are applied to the control terminals of the respective switches TH and TL by driver circuits (DRV), respectively 112H and 112L, also called close control circuit or transistor gate control circuits. Each signal SH, SL has low and high levels corresponding to respective desired states, for example, off and on, of the concerned switch TH, TL. In other words, signals SH and SL take values representative of the states of the respective switches TH, TL.

Driver 112H is typically powered with a voltage VDDH referenced with respect to a potential REFH, and driver 112L is typically powered with a voltage VDDL referenced with respect to a potential REFL. Voltage referenced with respect to a potential or voltage referenced to this potential means that this potential is applied to a first node (terminal 114H, 114L in respective circuits 112H, 112L) and that this voltage is applied between a second node (terminal 116H, 116L in respective circuits 112H, 112L) and the first node. Potentials REFH and REFL thus form reference potentials for the controls of respective switches TH and TL.

Potentials REFH and REFL are generally different. For example, they are the potentials of the source terminals of respective switches TH, TL. More particularly, potentials REFH and REFL are generally variable with respect to each other (that is, their difference varies) in relation with the switching and/or in relation with the variations of voltage V when it is an AC voltage.

Signals SH and SL are typically square pulse signals. Square pulse signal means a signal comprising a succession of cycles, each cycle being formed of a portion at a low level of the signal and of a portion at a high level of the signal. The cycles of signals SH and SL are repeated at a switching frequency. Thus, at the switching frequency, alternately, switch TH is turned on and switch TL is turned off, and then switch TL is turned on and switch TH is turned off. The switching frequency is for example smaller than or equal to 1 MHz.

Signals SH and SL are typically delivered by a signal generation circuit 120 (CTRL). Circuit 120 is coupled to circuits 112H and 112L by respective links 122H and 122L. Circuit 120 may comprise a sequential data processing unit, such as a microprocessor, implementing a signal generation method to obtain the desired operation of the switched-mode converter. This method is not described in detail, the described embodiments being compatible with usual methods of generation of signals for controlling switched-mode converter switches.

Signal generation circuit 120 is typically powered with a voltage VDD0 referenced to a potential REF0, for example, a ground. Potential REF0 is different from potentials REFH and/or REFL. More particularly, potentials REFH and/or REFL generally vary with respect to potential REF0 in relation with the switching and/or in relation with the variations of voltage V when it is an AC voltage.

Links 122H and 122L each comprise means, not shown, for transmitting respective signals SH and SL, by changing their potential reference, between signal generation circuit 120 and the respective drivers 112H and 112L.

However, the transmission of signals SH and SL over respective links 122H and 122L raises various issues linked to the variations between potentials REFH and/or REFL and/or REF0. As an example, the variations of potentials REFH and/or REFL and/or REF0 with respect to one another have an amplitude greater than 300 V, for example in the order of 500 V. As an example, these variations are fast, that is, occur at a speed (often noted dV/dt) reaching or temporarily exceeding 50 V/ns (for example, at each switching). These fast variations may be the source of errors in the transmission of signals SH and SL over links 122H and 122L.

The faster the switching, the greater these issues. The described embodiments provide in particular solving at least part of these issues.

The described embodiments are applicable to any switched-mode converter. In particular, the converter may deliver and/or receive a single-phase or multiphase AC voltage. The described embodiments are also applicable to any converter comprising, between two nodes of application of a voltage, for example, an AC voltage, or of application of a phase of a multiphase AC voltage, one or a plurality of branches in parallel, each formed of a switching cell comprising at least two switches in series Thus, the converter may deliver a voltage, for example, a multiphase AC voltage, to a motor and/or receive a multiphase AC voltage originating from an alternator.

Figure 2:
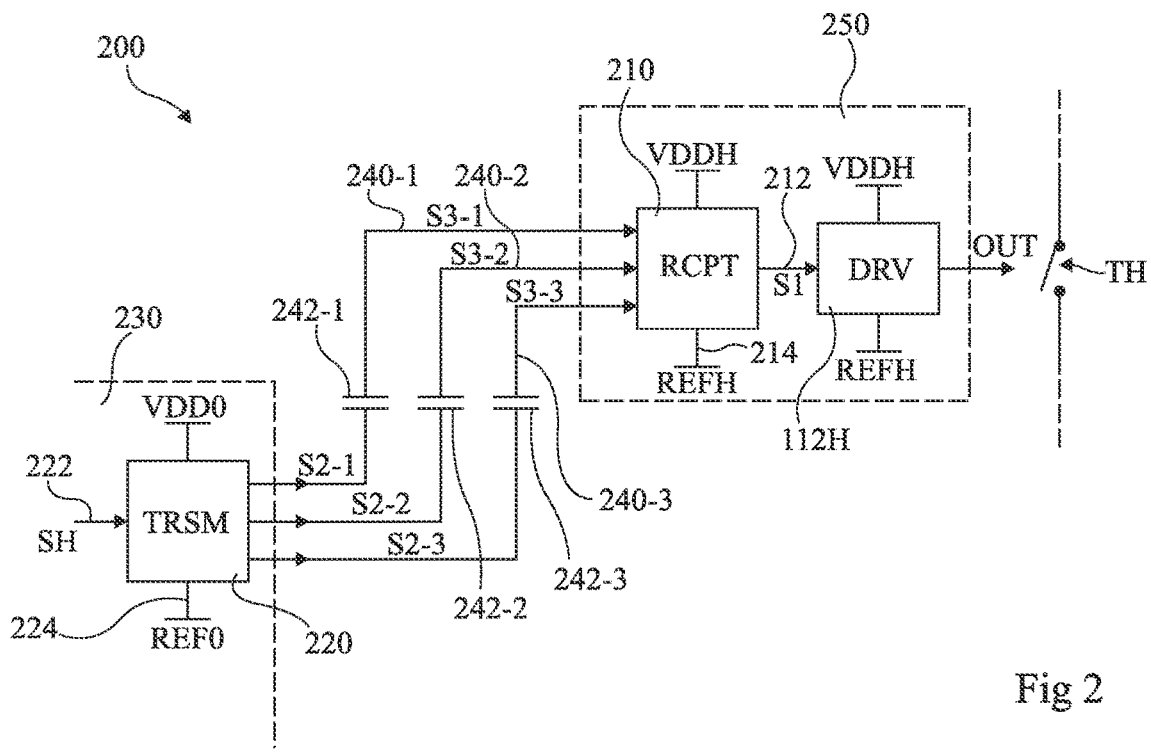
FIG. 2 schematically shows an embodiment of a switch control circuit.

FIG. 2 schematically shows an embodiment of a switch control circuit 200.

Control circuit 200 is preferably comprised within a switching cell of a converter, such as the cell 100 described hereabove in relation with FIG. 1. In the shown example, control circuit 200 is used to control the switch TH of switching cell 100. More particularly, control circuit 200 applies a signal OUT to the control terminal of the controlled switch. Control circuit 200 then comprises a driver (DRV) 112H of the type of that described in relation with FIG. 1, powered with voltage VDDH and delivering the signal OUT applied to the control terminal of switch TH (FIG. 1).

A portion of control circuit 200 is referenced to potential REFH for controlling switch TH and comprises driver circuit 112H and a circuit, or module, 210 (RCPT). Circuit referenced to a potential means that the voltages of this circuit in operation are referenced with respect to this potential. Module 210 delivers to driver 112H a control signal S1 to be applied to switch TH. In other words, control signal S1 conveys a value representative of a state of switch TH, this value being to be applied to switch TH. Module 210 is powered, for example, with voltage VDDH. Signal S1 is referenced to potential REFH, in other words, signal S1 is applied to a node or terminal 212, potential REFH is applied to a node or terminal 214, and the value taken by signal S1 is a function of the voltage between node 212 and node 214.

Preferably, another portion of control circuit 200 is referenced to the potential REF0 of a signal generation circuit of the type of the circuit 120 described in relation with FIG. 1, and forms a circuit, or module, 220 (TRSM). In other words, the circuits for generating signals 120 and module 220 form part of a transmitter assembly or block 230 referenced with respect to the same potential REF0. Module 220 is for example powered with voltage VDD0. Module 220 receives signal SH for controlling switch TH. Signal SH is referenced to potential REF0, in other words, signal SH is applied to a node or terminal 222, potential REF0 is applied to a node or terminal 224, and the value taken by signal SH is a function of the voltage between node 222 and node 224.

Control circuit 200 comprises a plurality of links 240-$i$. Index $i$ varies between 1 and the number N of links. Preferably, the number N of links is equal to three, and control circuit 200 then comprises three links 240-1, 240-2, and 240-3. The number of links may however be equal to two or be greater than three.

An embodiment of a switching cell may differ from the switching cell 100 of FIG. 1 in that links 240-$i$ and modules 210 and 220 replace link 122H (FIG. 1).

Preferably, each of links 240-$i$ comprises a capacitive element 242-$i$ (242-1, 242-2, 242-3) having its terminals coupled, preferably connected, respectively to modules 210 and 220. Each capacitive element 242-$i$ may comprise a capacitor or a plurality of capacitors in series or in parallel.

The embodiments of switched-mode converters are not limited to the example shown in FIG. 2. A control circuit of the type of the shown example may also replace link 122L (FIG. 1) and be used to control switch TL (FIG. 1). This control circuit is similar to circuit 200, with the difference that voltage VDDH referenced to potential REFH is replaced with voltage VDDL referenced to potential REFL, circuit 112H is replaced with a driver 112L of the type of that in FIG. 1, and signal SH is replaced with signal SL (FIG. 1). The provision of identical or similar control circuits for switches TH and TL enables delays linked to the propagation times of signals to be identical in both control circuits, which eases the generation of circuits SL and SH.

More generally, a control circuit such as circuit 200 may be provided in any device comprising a switch receiving a control signal referenced to a first potential, such as the potential REFH of the shown example, this device receiving a signal, such as signal SH, representative of a desired state of the switch and referenced to a second potential such as potential REF0.

Preferably, the assembly of module 210 and of driver 112H forms a monolithic circuit 250, or is comprised within a monolithic device further comprising, possibly, switch TH. More preferably, control circuit 200 is comprised in a monolithic device. Monolithic device means that all the circuits of the device are integrated inside and on top of a same substrate or support, typically inside and on top of a same semiconductor wafer portion. Such a monolithic device, or integrated circuit, is preferably located in an integrated circuit package. Integrated circuit package means an assembly, preferably tight, having areas of connection or pins of connection to electronic circuits external to the circuit, for example, to a printed circuit board PCB, jutting out of it. As compared with a device comprising a plurality of monolithic circuits, this allows an easier implementation, in particular to form a switching cell.

An advantage is that links 240-$i$ galvanically insulate modules 210 and 220 from each other. This enables, in particular, to control a plurality of switches (for example, of a converter) having potentials variable with respect to one other, from a same control signal generation circuit. In variants, each link 240-$i$ may comprise, in addition to or replacing capacitive element 242-$i$, one or more elements such as a transformer, an inductive element, or an optocoupler. However, as compared with these variants, links by capacitive elements 242-$i$ only have the advantage of simplifying the obtaining of the galvanic insulation and/or the obtaining of a monolithic device comprising control circuit 200.

In operation, the module 220 of transmitter block 230 delivers signals S2-$i$ (S2-1, S2-2, S2-3) over respective links 240-$i$. In other words, for each link 240-$i$, module 220 delivers signal S2-$i$ on an output coupled to module 210 by this link 240-$i$. At their output of module 220, the signals are referenced to potential REF0.

At least two of signals S2-$i$, for example, signals S2-2 and S2-3, are phase-shifted with respect to each other. The phase shift between these two signals is a function of the level of signal SH for controlling switch TH. In other words, the phase shift between the signals, for example, S2-2 and S2-3, is representative of the desired on/off state of switch TH. For example, signal S2-2 is phase advanced with respect to signal S2-3 when the desired state of switch TH is off and signal S2-2 is phase lagged with respect to signal S2-3 when the desired state of switch TH is on.

For this purpose, signals S2-$i$ preferably have a frequency greater than the switching frequency, for example, greater than or equal to 10 times the switching frequency, for example, greater than or equal to 10 MHz.

Signals S2-$i$ are transmitted over the respective links 240-$i$. This transmission is preferably performed via capacitive elements 242-$i$.

Signals S2-$i$, after having been conveyed over respective links 240-$i$, correspond to respective signals S3-$i$ received by module 210. Signals S3-$i$ are referenced to potential REFH. In the absence of a transmission error, signals S3-$i$ have between one another phase shifts identical to the respective phase shifts between signals S2-$i$.

The transmission of signals S2-$i$ and the reception of signals S3-$i$ with a change of reference potential is, preferably, obtained due to capacitive elements 242-$i$. In the absence of an error during the transmission, signals S3-$i$ then differ from the respective signals S2-$i$ only by their reference to potential REFH. In other words, signals S2-$i$ and S3-$i$ form same signals transmitted by capacitive elements 242-$i$ and received by module 210.

Based on the phase shift between two of signals S3-$i$, for example, based on the phase shift between signals S3-2 and S3-3, module 210 obtains the value representative of the desired state of switch TH initially conveyed by signal SH. This representative value corresponds to the level of signal S1 delivered by module 210 to driver 112H. This representative value is applied to switch TH by driver 112H.

For example, when signal S3-2 is phase advanced with respect to signal S3-3, signal S1 is at a level causing the setting of switch TH to the off state, and when signal S3-2 is phase lagged with respect to signal S3-3, signal S1 is at a level causing the setting to the on state of switch TH.

The value representative of the desired state of switch TH may thus be applied to switch TH while the reference potentials REFH and REF0 of the respective circuits 210 and 220 vary with respect to each other. This particularly enables all the control signals of the converter switches, such as signals SH and SL, to be generated by the same circuit 120 (FIG. 1) referenced to potential REF0.

Signals S2-$i$ are variable square pulse signals having their values alternating between respectively high "1" and low "0" levels. All signals have the same frequency (of repetition of the square pulses) and are generated by module 220 by being phase-shifted with respect to one another by a value which is a function of the value or state "0" or "1" of signal SH. The frequency of signals S2-$i$ is greater than the switching frequency (of repetition of the square pulses of signal SH) Signals S2-$i$, which have become S3-$i$ after the capacitive decoupling, are processed by module 210 which detects the state of the phase shift between these signals and generates signal S1. Signal S1 takes the successive states of signal SH to control switch TH in all or nothing.

Although, in the above-described example, only switch TH is controlled by control circuit 200, a control circuit similar to control circuit 200 may be provided to control a plurality of switches. The control of these switches is for example referenced to a same potential. To achieve this, the control circuit may receive a plurality of control signals such as control signal SH. The control circuit may then transmit at least three signals S2-$i$ (corresponding, on reception thereof, to at least three signals S3-$i$) having between one another a plurality of phase shifts representative of the respective desired states of the switches.

The above-described example, where the potentials REF0 and REFH of the circuits are variable with respect to each other, is not limiting and it may also be provided for the potentials to be fixed with respect to one another, for example, at different levels.

Figure 3:
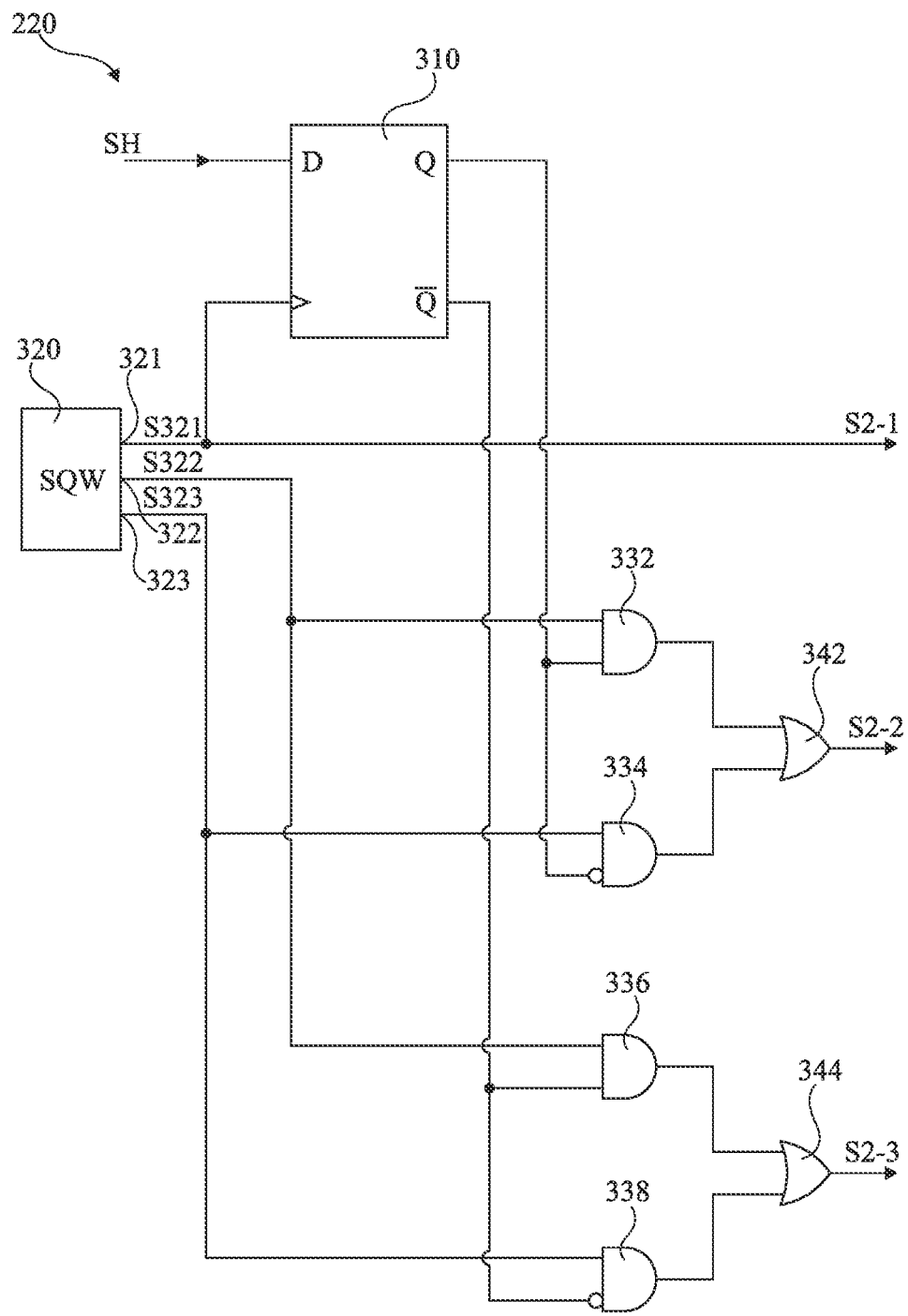
FIG. 3 schematically shows an embodiment of a portion of the control circuit of FIG. 2.

FIG. 3 schematically shows an embodiment of a module 220 for delivering the signals S2-$i$ of the control circuit 200 of FIG. 2.

Module 220 may comprise a D-type flip-flop 310. Such a flip-flop comprises a data input D, a clock input, and an output Q, and may comprise an output $\overline{Q}$, taking a level inverted with respect to that of the Q output. Flip-flop 310 receives signal SH.

Module 220 may comprise a signal generator 320 (SQW). More precisely, three signals S321, S322, and S323 of same frequency and phase-shifted with respect to one another are delivered by generator 320 on respective outputs 321, 322, and 323. An example of signals delivered by generator 320 is described hereafter in relation with FIG. 4.

Signal S2-1 is delivered by generator 320 on output 321 and forms the signal S321 delivered by module 220. The clock input of flip-flop 310 is coupled, preferably connected, to output 321, and thus receives signal S2-1.

Module 220 may comprise a logic AND gate 332 having an input coupled, preferably connected, to output 322, and another input coupled, preferably connected, to the Q output of flip-flop 310.

Module 220 may comprise a logic AND gate 334 having an input coupled, preferably connected, to output 323, and an inverting input coupled, preferably connected, to the Q output of flip-flop 310.

Module 220 may comprise a logic AND gate 336 having an input coupled, preferably connected, to output 323, and another input coupled, preferably connected, to the inverted output of flip-flop 310.

Module 220 may comprise a logic AND gate 338 having an input coupled, preferably connected, to output 324, and an inverting input coupled, preferably connected, to the inverted output of flip-flop 310.

Module 220 may comprise an OR logic gate 342 having two inputs coupled, preferably connected, to the outputs of the respective AND gates 332 and 334. Logic OR gate 342 delivers, on its output, signal S2-2.

Module 220 may comprise an OR logic gate 344 having two inputs coupled, preferably connected, to the outputs of the respective AND gates 336 and 338. Logic OR gate 344 delivers, on its output, signal S2-3.

Although this is not shown, flip-flop 310, generator 320, logic AND gates 332, 334, 336, 338, and logic OR gates 342 and 344 are powered with voltage VDD0 (FIG. 2) referenced to potential REF0.

In operation, when signal SH is at a high level, for example, during a rising edge of signal S2-1, the non-inverting output of flip-flop 310 switches to a high level and the inverting output of flip-flop 310 switches to a low level. The outputs of AND gates 334 and 336 remain at the low level, and the outputs of AND gates 332 and 338 take the logic levels of respective outputs 322 and 323. Signals S2-2 and S2-3 take the logic levels of the respective outputs 322 and 323.

When signal SH is at a low level, for example, during a rising edge of signal S2-1, the non-inverting output of flip-flop 310 switches to a low level and the inverting output of flip-flop 310 switches to a high level. The outputs of AND gates 332 and 338 are at the low level, and the outputs of AND gates 334 and 336 take the logic levels of respective outputs 323 and 322. Signals S2-2 and S2-3 take the logic levels of the respective outputs 323 and 322.

Thus, signals S2-2 and S2-3 take the logic levels of respective outputs 322 and 323 when signal SH is at the high level, and of the respective permuted outputs 323 and 322 when signal SH is at the low level. Due to the fact that the signals present on outputs 322 and 323 are phase-shifted, this results in that the phase shift between the two signals S2-2 and S2-3 takes opposite values for the two levels, low and high, of control signal SH.

The specific example of module 220 described hereabove is not limiting. Module 220 may be formed by any device enabling to generate signals between which a phase shift takes different values for the low and high levels of control signal SH. In particular, flip-flop 310, logic AND gates 332, 334, 336, 338, and logic OR gates 342 and 344 may be replaced with any circuit adapted to delivering signals taking the logic levels of the respective outputs 322 and 323 when signal SH is at the high level, and of the respective permuted outputs 323 and 322 when signal SH is at the low level. Generator 320 may be replaced with a generator of only two signals or of more than three signals.

Preferably, the outputs of module 220 delivering signals S2-$i$ each have an internal impedance (not shown) capable, during variations of potentials REFH and REF0 with respect to each other, of keeping voltage values of signals S2-$i$ within a nominal voltage range. In other words, module 220 is capable of absorbing peaks of the charge/discharge current of capacitive elements 242-$i$ during these variations, including during fast variations. This may be implemented by any component currently used to absorb a current peak, for example, a capacitive element.

Figure 4:
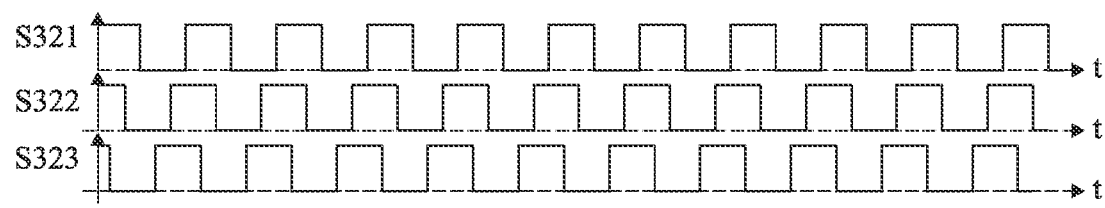
FIG. 4 shows, in the form of simplified timing diagrams, shapes of signals in an example of a switch control method implemented by the circuit of FIG. 2, according to an embodiment.

FIG. 4 shows, in the form of simplified timing diagrams, shapes of signals in an example of a switch control method implemented by the control circuit 200 of FIG. 2, according to an embodiment. More precisely, examples of curves of signals S321, S322, and S323 generated by generator 320 in the example of the module 220 of FIG. 3, have been shown according to time t.

In this example, signals S322 and S321 have between each other a first phase shift, and signals S323 and S321 have between each other a second phase shift which is double or substantially double the first phase shift. As an example, signals S323 and S322 are advanced with respect to signal S321.

The first and second phase shifts are preferably greater than 10 degrees, whereby the phase shift between signals S2-2 and S2-3 (FIGS. 2 and 3) is greater, in absolute value, than 10 degrees. As compared with lower values of the phase shift, this enables to ease the measurement of the phase shift between signals S2-2 and S2-3 and, thus, to obtain the desired state of switch TH (FIG. 2). In the shown example, the first and second phase shifts are respectively equal to $\pi/3$ and $2\pi/3$. In another example, the first and second phase shifts may be respectively equal to $\pi/6$ and $\pi/3$. The first and second phase shifts are smaller than $\pi$, which enables to distinguish a phase advance from a phase lag.

In each of signals S321, S322, and S323, the duration of the high state at each cycle is preferably substantially equal to that of the low state, for example equal to that of the low state. In other words, signals S2-$i$ each have, outside of the state changes of flip-flop 310, a duty cycle preferably equal to approximately 0.5, for example, equal to 0.5.

Preferably, the phase shifts and the duty cycles of signals S321, S322, and S323 are selected so that signal S321 is at a same first level (the low level in the shown example) during rising edges of signals S322 and S323, and at a same second level (the high level in the shown example) during falling edges of signals S322 and S323. This is for example obtained with the duty cycles equal to 0.5 and the first and second phase shifts smaller than π. As a result, signal S2-1 is at the first level during rising edges of signals S2-2 and S2-3, and at the second level during falling edges of signals S2-2 and S2-3.

Figure 5:
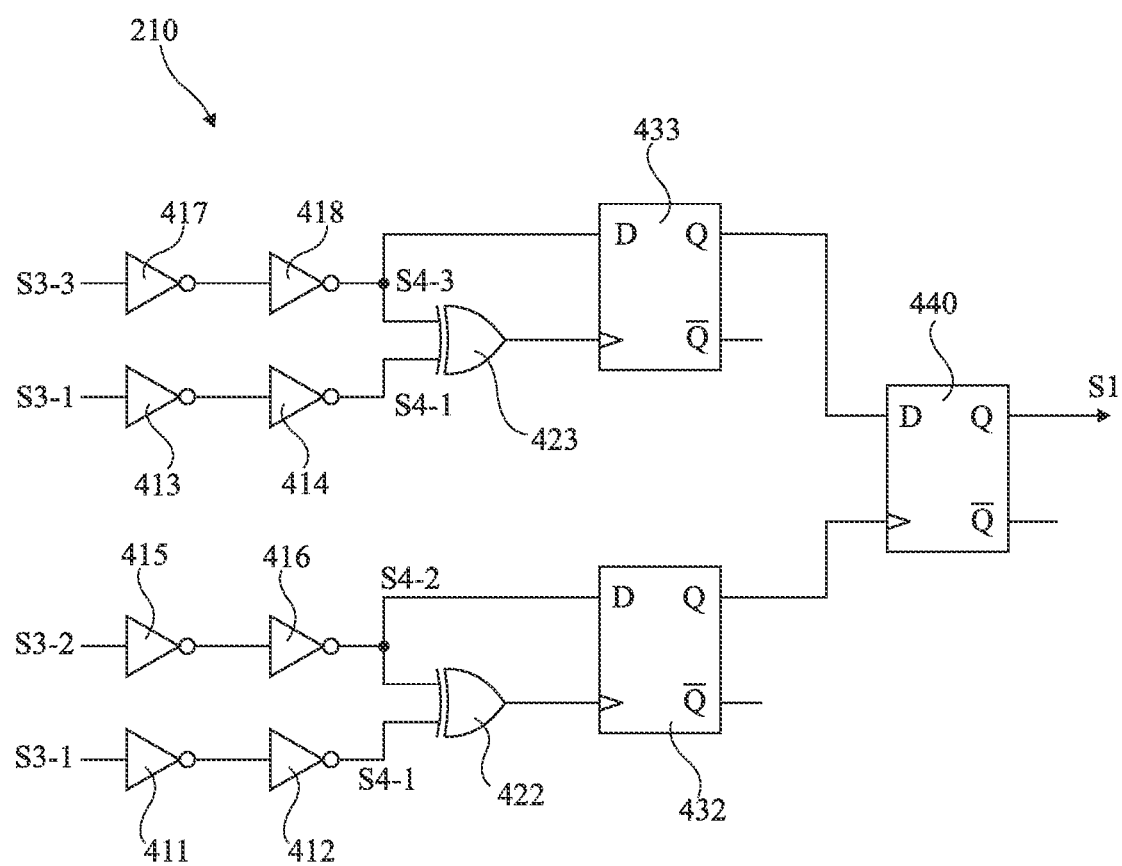
FIG. 5 schematically shows an embodiment of another portion of the circuit of FIG. 2.

FIG. 5 schematically shows an embodiment of the module 210 of the control circuit 200 of FIG. 2.

Module 210 receives signals S3-$i$. In the shown example, signal S3-1 is received on the input of an inverter 411 having its output coupled, preferably connected, to the input of an inverter 412. In this example, signal S3-1 is, further, received on the input of an inverter 413 having its output coupled, preferably connected, to the input of an inverter 414. Inverters 412 and 414 deliver a same signal S4-1 referenced to potential REFH (not shown in FIG. 5). Still in this example, signal S3-2 is received on the input of an inverter 415 having its output coupled, preferably connected, to the input of an inverter 416. Signal S3-3 may be received on the input of an inverter 417 having its output coupled, preferably connected, to the input of an inverter 418. In this example, Inverters 416 and 418 deliver respective signals S4-2 and S4-3 referenced to potential REFH.

Thus, each signal S3-$i$ is received by a pair of inverters in series which delivers a signal S4-$i$. Each signal S4-$i$ takes the logic level of the corresponding signal S3-$i$, in the absence of an error in the transmission of signal S3-$i$ over link 240-$i$.

As a variant, one or a plurality of the pairs of inverters 411 and 412, 413 and 414, 415 and 416, and 417 and 418, may be omitted and each of the omitted pair may be replaced with a direct connection. However, as compared with this variant, the inverters enable to limit the voltage values taken by these signals to two voltage values corresponding to the logic levels of these signals, which simplifies the implementation of the step of obtaining of the desired state of switch TH (not shown in FIG. 5), implemented by the elements of module 210 described hereafter.

Module 210 may comprise an EXCLUSIVE OR gate, also called XOR gate, 422. XOR gate 422 has two inputs coupled, preferably connected, to the outputs of respective inverters 412 and 416. In other words, XOR gate 422 receives signals S4-1 and S4-2.

Module 210 may comprise a D-type flip-flop 432. The D input of flip-flop 432 is coupled, preferably connected, to the output of inverter 416. In other words, the D input of flip-flop 432 receives signal S4-2. The clock input of flip-flop 432 is coupled, preferably connected, to the output of XOR gate 422.

Module 210 may comprise an XOR gate 423. XOR gate 423 has two inputs coupled, preferably connected, to the outputs of respective inverters 414 and 418. In other words, XOR gate 423 receives signals S4-1 and S4-3.

Module 210 may comprise a D-type flip-flop 433. The D input of flip-flop 433 is coupled, preferably connected, to the output of inverter 418. In other words, the D input of flip-flop 433 receives signal S4-3. The clock input of flip-flop 433 is coupled, preferably connected, to the output of XOR gate 423.

Module 210 may comprise a D-type flip-flop 440. The D input of flip-flop 440 is coupled, preferably connected, to the Q output of flip-flop 433. The clock input of flip-flop 440 is coupled, preferably connected, to the Q output of flip-flop 432. The Q output of flip-flop 440 delivers the control signal S1 to be applied to switch TH.

Although this is not shown, XOR gates 422 and 423, flip-flops 432, 433, and 440, and inverters 411, 412, 413, 414, 415, 416, 417, and 418 are powered with voltage VDDH (FIG. 2) referenced to potential REFH.

Figure 6:
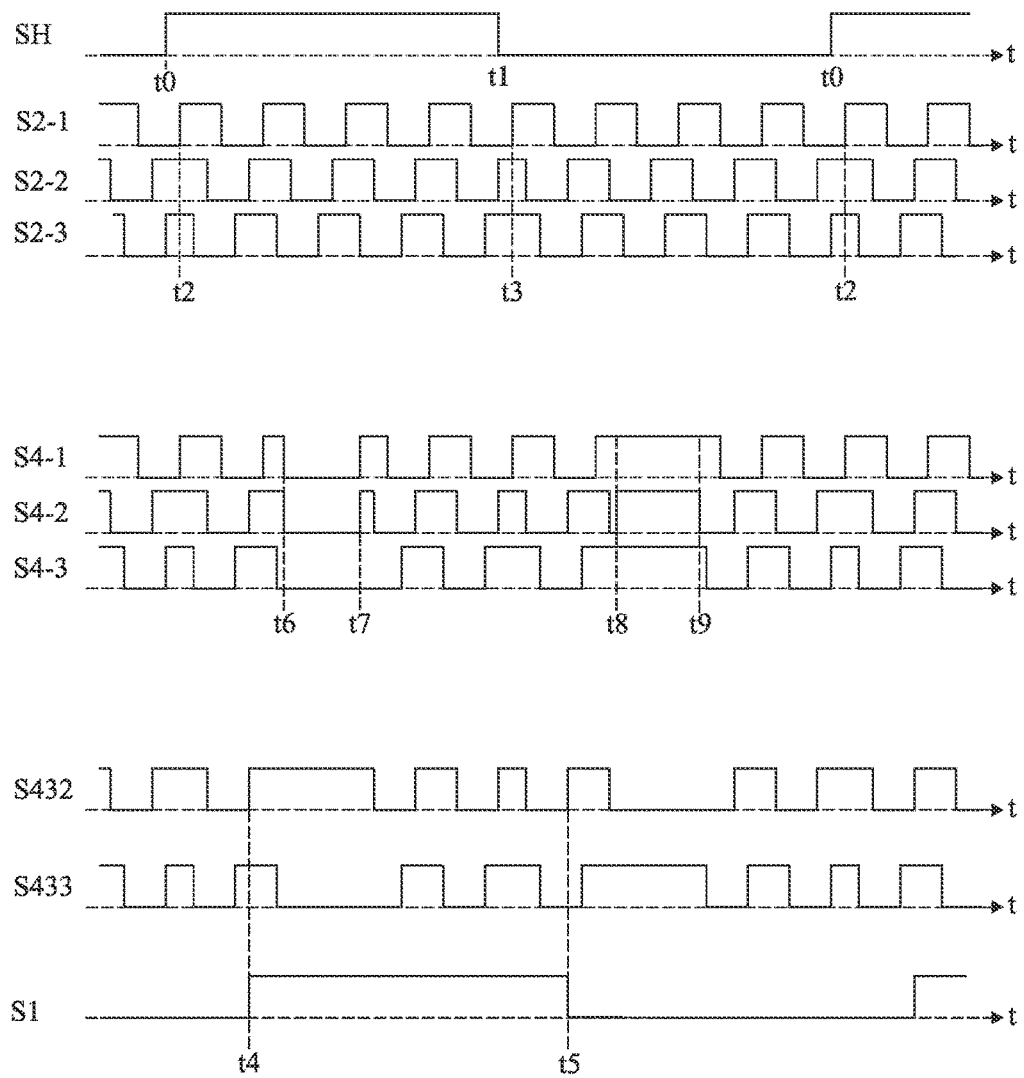
FIG. 6 shows, in the form of simplified timing diagrams, shapes of other signals in an embodiment of a switch control method implemented by the circuit of FIG. 2.

The operation of module 210 is described hereafter, in relation with FIG. 6, in the example of FIG. 4 of operation of module 220.

FIG. 6 shows, in the form of simplified timing diagrams, shapes of signals in an embodiment of a switch control method implemented by the control circuit 200 of FIG. 2. In this example, the modules 210 and 220 of control circuit 200 correspond to the examples described hereabove in relation with FIGS. 3, 4, and 5.

One has shown the curves over time t:
- of the control signal SH received by module 220;
- of the signals S2-1, S2-2, and S2-3 delivered by module 220;
- of the signals S4-1, S4-2, and S4-3, corresponding to the respective signals S3-1, S3-2, and S3-3 after their reception by module 210;
- of the signals S432 and S433 delivered by the Q outputs of the respective flip-flops 432 and 433; and
- of the control signal S1 delivered by module 210.

In the shown example, signals S3-1, S3-2, and S3-3 have a frequency equal to 8 times the switching frequency (that of signal SH), which is smaller than the preferred frequencies described hereabove for signals S3-1, S3-2, and S3-3, to improve the readability of FIG. 6.

Signal SH switches from its low level to its high level at times t0, and from its high level to its low level at times t1. In the shown example, the duty cycle of signal SH, defined by the ratio of the duration for which signal SH is at its high level at each switching cycle to the duration of a switching cycle, is equal to approximately 0.5. This is not limiting, and the duty cycle may take any value in the range from 0 to 1.

After each time t0, at a time t2, signal S3-1 exhibits a rising edge between its low state and its high state. More precisely, time t2 is, among the times of the rising edges of signal S3-1 located after time t0, that which is closest to this time t0. Similarly, after each time t1, at a time t3, signal S3-1 exhibits another rising edge. Time t3 is, among the times of the rising edges of signal S3-1 located after time t1, that which is closest to this time t1.

Between each time t2 and the next time t3, signal S3-2 is phase-lagged with respect to signal S3-3. Between each time t3 and the next time t2, signal S3-2 is phase-advanced with respect to signal S3-3.

As mentioned hereabove, in the absence of a transmission error between modules 220 and 210, signals S4-1, S4-2, and S4-3 are at the same logic levels as the respective signals S3-1, S3-2, and S3-3, to within propagation delays, not shown.

As mentioned hereabove, signal S3-1 is at its low level during rising edges of signals S3-2 and S3-3, and at its high level during falling edges of signals S3-2 and S3-3. As a result, at each of the rising and falling edges of signals S3-2 and S3-3, in the absence of a transmission error between modules 220 and 210, the concerned XOR gate 422, 423 exhibits at rising edge at its output. Accordingly, in the absence of a transmission error, and to within propagation delays, not shown, signals S432 and S433 are at the same logic levels as respective signals S3-2 and S3-3.

After each time t2, signal S432 exhibits a rising edge at a time t4. Due to the fact that signal S3-3 is phase-advanced with respect to signal S3-2, signal S433 is at its high level at time t4, and signal S1 thus switches to its high level.

After each time t3, Signal S432 exhibits a rising edge at a time t5. Due to the fact that signal S3-3 is phase-lagged with respect to signal S3-2, signal S433 is at its low level at time t5, and signal S1 thus switches to its low level.

Thus, at each rising edge of signal S432, the level of signal S433 is representative of the sign of the phase shift between signals S432 and S433. At each rising edge of signal S432, flip-flop 440 stores the sign of the phase shift. This stored value is maintained between the rising edges. The sign of the phase shift has thus been measured, and the level of signal S1 corresponds to the measured sign. As a result, the level of signal S1 is representative of the desired state of switch TH.

Flip-flop 440 may be replaced with any circuit capable of storing the level of a first signal (such as signal S433) at times at which this level is representative of the desired state of switch TH and, out of these times, of giving signal S1 the stored level. These times may correspond to any switching, such as rising or falling edges, of a second signal (such as signal S432) between two levels of this second signal.

From time t4, switch TH is set to the on state. Switch TH is fully conductive at a time subsequent to time t4. A fast variation, such as defined hereabove, between potentials REFH and REF0 (FIG. 2) caused by the setting to the on state of switch TH, is likely to occur between times t6 and t7. This fast variation is likely to cause an error in the transmission of signals S3-$i$ between modules 220 and 210 (FIG. 2). Typically, between times t6 and t7, signals S4-$i$ are at the low level.

Similarly, after time t5, switch TH is set to the off state, and an error in the transmission of signals S3-$i$ is likely to occur between times t8 and t9. Typically, between times t8 and t9, signals S4-$i$ remain at the high level.

Thus, between times t5 and t6, and between times t8 and t9, the phase shifts which could be measured between signals S4-2 and S4-3 are not representative of the desired state of switch TH. In other words, the phase shift between signal S4-2 and S4-3 is in a non-valid state between times t5 and t6 and between times t8 and t9. The phase shift is in a valid state when the transmission of signals S3-$i$ is performed with no error.

For each of signals S4-2 and S4-3, the concerned XOR gate, respectively 422, 423, compares this signal S4-2, S4-3 with signal S4-1. Between times t6 and t7, and between times t8 and t9, for each of signals S4-2 and S4-3, the result of the comparison shows that the level of this signal S4-2, S4-3 and that of signal S4-1 are the same. The XOR gate, respectively 422, 423, thus does not deliver an edge at the clock input of the respective flip-flop 432, 433. The flip-flop, respectively 432, 433, keeps the level stored between time t6 or t8 of the respective signal S4-2, S4-3. The respective flip-flop 432, 433 holds the respective signals S432, S433 at the stored level as long as the results of the comparisons of signals S4-2 and S4-3 with signal S4-1 correspond to a non-valid state of the phase shift between signals S4-2 and S4-3.

Thus, when the phase shift is in a non-valid state, no edge is received by the clock input of flip-flop 440. Signal S1, applied to switch TH, remains at the level stored by flip-flop 440. Thus, even when the phase shift between signals S4-2 and S4-3 is in a non-valid state, the level of signal S1 is representative of the desired state of switch TH.

In the above-described example, the comparisons of signals S4-2 and S4-3 with signal S4-1 are performed by XOR gates. This is not limiting, a state of the phase shift between signals S4-2 and S4-3 may be determined among the valid and non-valid states in any manner, for example, according to the result of any comparison of signals S4-2 and S4-3 with signal S4-1 enabling to detect an error in the transmission of signals S4-$i$.

In the above-described example, flip-flops 432 and 433 have the function of storing the levels taken by signals S4-2 and S4-3 when their phase shift is in the valid state, and of holding the levels of these signals at the stored levels when the phase shift is in the non-valid state. However, flip-flops 432 and 433 may be replaced with any circuit capable of fulfilling this function.

A specific example of module 210 has been described hereabove, implementing the following operations:
when the phase shift between signals S4-2 and S4-3 is in the valid state, the storage of a value representative of the desired state of switch TH; and
when the phase shift between signals S4-2 and S4-3 is in a non-valid state, the delivery of the stored value to be applied to switch TH.

This example is not limiting, and module 210 may be any circuit capable, when a phase shift is in a valid state, of storing a value of this phase shift, and, when this phase shift is in a non-valid state, of delivering this value.

In a variant, signal S3-1, inverters 411, 412, 413, and 414, XOR gates 422 and 423, and flip-flops 432 and 433 are omitted. Flip-flop 440 directly receives signal S4-3 on its D input and signal S3-3 on its clock input. This variant may be implemented when the variations of potentials REFH and REF0 with respect to each other are sufficiently slow for the transmission of the signals between modules 220 and 210 to be performed with no error.

As compared with this variant, the fact of providing signal S3-1 enables to determine the valid/non-valid state of the phase shift between signals S3-2 and S3-3, and enables to apply to switch TH a value representative of the desired state even when errors occur during the transmission between modules 220 and 210. The switching speed of switch TH can thus be increased with no risk for the control signal applied to switch TH to be temporarily at a non-desired level. This thus enables, as compared with known converters, to accelerate the switching frequency and/or to increase the reliability level. According to an advantage, the higher the switching frequency, the more compact the converter can be and/or the higher its energy efficiency can be.

Figure 7:
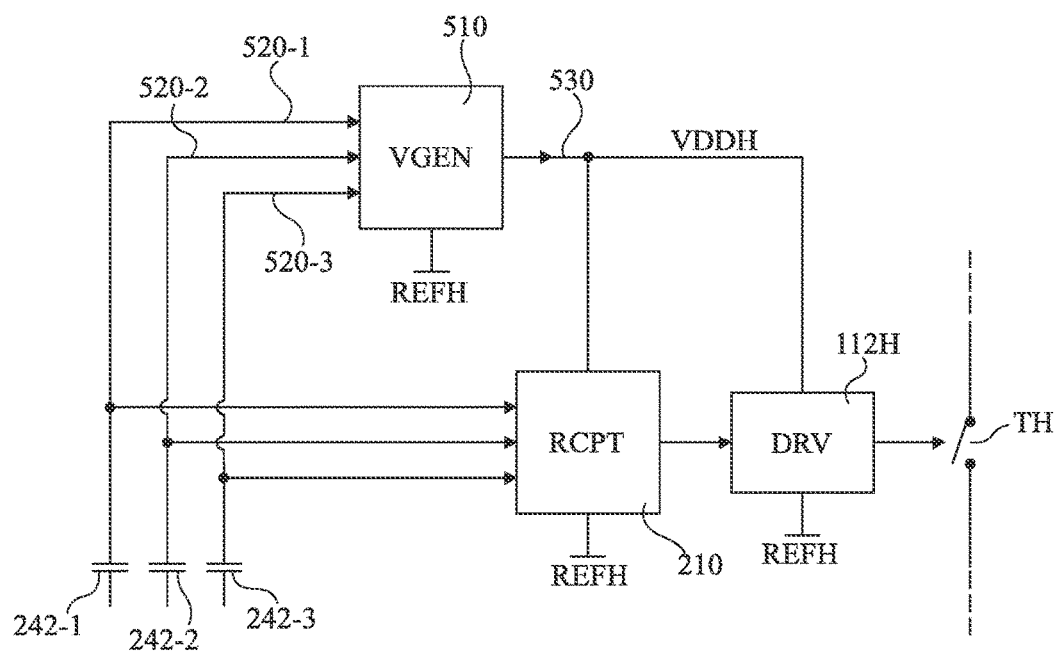
FIG. 7 schematically shows an embodiment of still another portion of the circuit of FIG. 2.

FIG. 7 schematically shows an embodiment of still another portion of the control circuit 200 of FIG. 2. More precisely, module 210, driver 112H, switch TH, and capacitive elements 242-$i$ (242-1, 242-2, 242-3) have been shown as coupled to module 210.

Control circuit 200 comprises a voltage generator 510 (VGEN). Generator 510 delivers voltage VDDH referenced to potential REFH which power module 210 and which, preferably, also powers driver 112H.

According to the present embodiment, generator 510 receives, on respective inputs 520-$i$ (520-1, 520-2, 520-3), signals S3-$i$, or one or a plurality of signals S3-$i$, after their transmission by capacitive elements 242-$i$. Generator 510 uses an energy conveyed by the signals S3-$i$ that it receives to generate voltage VDDH on an output 530.

During the starting of the converter, the application of signals S3-$i$ is sufficient to deliver voltage VDDH enabling to set switch TH to the on state. The converter thus is advantageously started in a particular simple fashion.

The control circuit 200 according to the present embodiment advantageously transmits to circuits 210 (RCPT) and 112H, which apply the desired control signal to switch TH, both the level of signal SH for controlling switch TH (transmitted as described hereabove in relation with FIGS. 2 to 6) and the energy enabling to power these circuits 210 and 112H.

Figure 8:
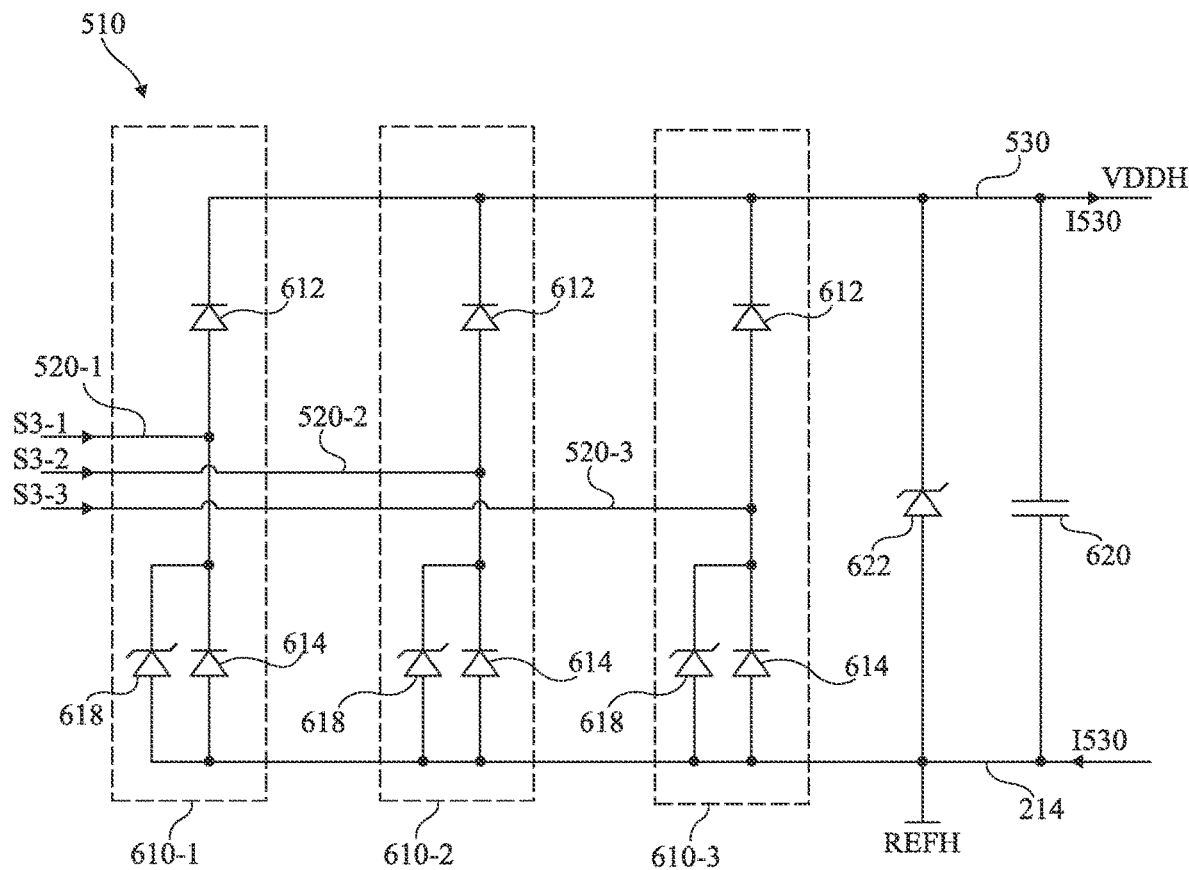
FIG. 8 schematically shows an example of a circuit of the embodiment of FIG. 7.

FIG. 8 schematically shows an example of the generator 510 of the embodiment of FIG. 7.

Preferably, generator 510 comprises a rectifying circuit. More preferably, generator 510 comprises a rectifying circuit 610-$i$ for each of signals S3-$i$, that is, in the shown example, three rectifying circuits 610-1, 610-2, 610-3 for the three respective signals S3-1, S3-2, and S3-3.

Each rectifying circuit 610-$i$ comprises two diodes 612, 614 electrically in series between the node 214 of application of reference potential REFH and the output 530 of generator 510. Signal S3-$i$ is received on a node of series connection of diodes 612 and 614, this node forming the input 520-$i$ of generator 510. Diode 612 is located on the side of output 530. Diodes 612 and 614 have their cathodes facing output 530.

Generator 510 further comprises a capacitive element 620 coupling output 530 to the node 214 of application of potential REFH. Capacitive element 620 may comprise one or a plurality of capacitors in parallel.

Voltage VDDH, referenced with respect to potential REFH and delivered by rectifying circuits 610-$i$, may be equal to a potential difference between the high and low states of signals S3-$i$, to within voltage drops in diodes 612 and 614. In other words, voltage VDDH may be equal to the amplitude of the voltage variations exhibited by signals S3-$i$, to within diode threshold voltages. Preferably, this amplitude is in the range from 3 V to 12 V, for example, in the order of 6 V.

Capacitive element 620 has a capacitance value sufficient to limit the ripple of voltage VDDH to the frequency of signals S3-$i$. As an example, the capacitance value of capacitive element 620 is in the range from 0.1 nF to 10 nF, for example is in the order of 1 nF. The amplitude of the ripple may be calculated in a way usually implemented to calculate the voltage ripple of a rectifying circuit.

According to an advantage, diodes 614 enable, when potential REFH increases with respect to potential REF0, to charge capacitive elements 242-$i$. This may also be obtained, in the absence of generator 510, by any device capable of charging capacitive elements 242-$i$.

According to another advantage, module 210 and driver 112H sample a current I530 from output 530. As compared with embodiments where generator 510 is omitted, this enables to discharge capacitive elements 242-$i$ (FIG. 7) faster when potential REFH decreases with respect to potential REF0 (FIG. 2). This enables to limit the duration between times t6 and t7 (FIG. 6) during which an error risks occurring in the transmission of signals S3-$i$. This may also be obtained, in the absence of or as a complement to generator 510, by any device capable of discharging the capacitive elements between times t6 and t7.

Preferably, each rectifying circuit comprises a Zener diode 618 coupling the concerned input 520-$i$ to the node 214 of application of reference potential REFH. In each rectifying circuit, the cathode of Zener diode 618 faces input 520-$i$. As a complement of or to replace Zener diodes 618, a Zener diode 622 electrically in parallel with capacitive element 620 may be provided, the cathode of Zener diode 622 facing output 530. When potential REFH decreases with respect to potential REF0, Zener diodes 618 and/or 622 enable to discharge capacitive elements 242-$i$. This enables, as mentioned hereabove, to decrease the duration for which an error may occur during the transmission of signals S3-$i$.

Further, Zener diodes 618 and/or 622 enable, when potential REFH decreases with respect to potential REF0, voltage VDDH to remain smaller than a given voltage threshold. Preferably, this threshold is greater than the amplitude of the voltage variations of signals S3-$i$. In other words, Zener diodes 618 and/or 622 form a circuit for clipping voltage VDDH and, preferably, voltages of the signals S3-$i$ received after their transmission by capacitive elements 242-$i$.

The duration between times t6 and t7 may be calculated, based on the above indications, by using any usual method of calculation of the discharge of a capacitor. In particular, in the case where current I530 has, according to time, variations linked to the operation of the circuits powered with voltage VDDH, this calculation may be performed by means of any computer simulation tool. Preferably, capacitance values of capacitive elements 242-$i$ are selected according to current I530 and to the variations between potentials REFH and REF0 so that the duration calculated between times t8 and t7 is much smaller than the duration of a switching cycle, that is, so that it is more than 5 times smaller, preferably more than 10 times smaller, than the duration of a switching cycle. Preferably, capacitive elements 242-$i$ have the same capacitance value, or substantially the same capacitance value, typically in the range from 20 pF to 500 pF, for example, equal to approximately 100 pF.

Figure 9:
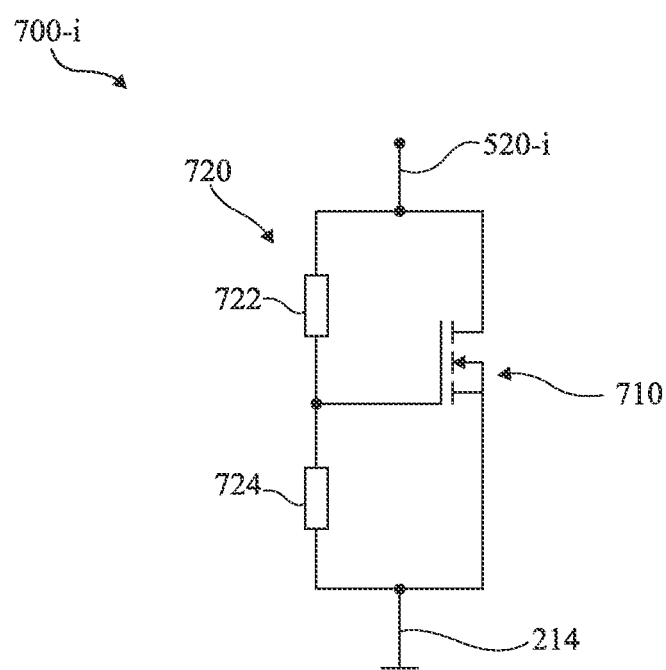
FIG. 9 partially and schematically shows an alternative embodiment of the circuit of FIG. 8.

FIG. 9 schematically shows a circuit 700-$i$ of an alternative embodiment of generator 510

Circuit 700-$i$ couples one of inputs 520-$i$ to the node 214 of application of reference potential REFH. In the example of the generator 510 of FIG. 8, each input 520-$i$ may be coupled to node 214 by a circuit 700-$i$ identical or similar to that shown. Each of the Zener diodes 618 of the generator 510 of FIG. 8 may be electrically in parallel with circuit 700-$i$ or be replaced with circuit 700-$i$.

Circuit 700-$i$ comprises a transistor 710, for example, of N-channel field-effect type, and a dividing bridge 720 coupling input 520-$i$ to the node 214 of application of the reference potential. Dividing bridge 702 may comprise two resistive elements 722, 724 electrically in series between 520-$i$ and node 214. Transistor 710 may have a drain terminal coupled to input 520-$i$ and a source terminal coupled to node 214. Transistor 710 may have a control terminal, for example, a gate terminal, coupled, preferably connected, to a node of series connection of resistive elements 722 and 724. In other words, the dividing bridge receives signal S3-$i$ and controls transistor 710.

The ratio between the values of resistors 722 and 724 is selected so that transistor 710 turns on when the voltage between input 520-$i$ and node 214 becomes greater than a threshold. Thus, circuit 700-$i$ may form all or part of a clipping circuit, as a complement of or to replace Zener diodes 618.

Resistors 722 and 724 further have the advantage, when potential REFH decreases with respect to potential REF0, to discharge the concerned capacitive element 242-$i$. The values of resistors 722 and 724 may be selected to limit the duration for which an error in the transmission of signals S2-$i$ risks occurring (between times t6 and t7, FIG. 6)

An advantage of the described embodiments is that it is now possible to detect a non-valid state of the control signals received by module 210 particularly due to variations of the reference potentials between the upstream and downstream circuits of the decoupling capacitors. Further, not only is this detection performed, but also does it not adversely affect the operation of the converter since a (the last) stored valid state is then used.

Another advantage of the described embodiments is that the phase-shifted control signals convey not only the information representative of the off or on state to be given to switch TH, but also the energy of module 210 and of circuit 112H.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

The invention claimed is:

1. Method of controlling at least one switch, comprising:
   the delivery, by a transmitter module and from a first square pulse signal, representative of the desired state of said switch and having cycles repeated at a switching frequency, of second square pulse signals all having a same frequency, greater than the switching frequency, said second square pulse signals having with respect to one another at least one phase shift having a value which is a function of the state of the first square pulse signal;
   the transmission of said second square pulse signals through capacitive elements delivering phase-shifted signals;
   the reception, by a receiver module, of the phase-shifted signals reproducing said at least one phase shift;
   the verification, by the receiver module, of a valid or invalid state of said at least one phase shift;
   the obtaining and the storage, when the state of said at least one phase shift is valid, of a value from said phase-shifted signals, said value being representative of the desired state of said at least one switch; and
   the application, to said at least one switch, of the obtained representative value if the state of said at least one phase shift is valid or of the stored representative value if the state of said at least one phase shift is invalid.

2. Method according to claim 1, wherein said transmitter module is referenced to a first potential, said receiver module being referenced to a second potential variable with respect to the first potential.

3. Method according to claim 2, wherein the second potential is a reference potential for controlling said at least one switch.

4. Method according to claim 1, wherein a generator of a voltage uses an energy conveyed by said signals.

5. Method according to claim 4, wherein the generator comprises a rectifying circuit.

6. Method according to claim 5, wherein said receiver module is powered with said voltage.

7. Method according to claim 4, wherein the generator comprises a clipping circuit having one or a plurality of Zener diodes and/or one of a plurality of transistors controlled by dividing bridges receiving said signals.

8. Circuit for controlling at least one switch comprising:
   at least one driver of application, to a control terminal of said at least one switch, of a square pulse control signal having cycles repeated at a switching frequency; and
   a module for receiving phase-shifted square pulse signals, representative of a desired state of said at least one switch, the frequency of the cycles of said phase-shifted signals being greater than the switching frequency and at least one phase shift between said phase-shifted signals having a different value according to the desired state of said at least one switch, the receiver module delivering, to said driver, a value corresponding to a value obtained and stored from said at least one phase shift when the state of said at least one phase shift is valid and to a stored value if the state of said at least one phase shift is invalid.

9. Circuit according to claim 8, comprising a generator of a voltage from an energy conveyed by said phase-shifted signals, the generator comprising a circuit for clipping said phase-shifted signals.

10. Circuit according to claim 8, comprising two logic gates each carrying out an XOR function, comparing a first phase-shifted signal respectively with a second and a third phase-shifted signal, the valid or non-valid state of said at least one phase shift being determined according to results of the comparisons.

11. Circuit according to claim 10, further comprising:
    a first and a second flip-flop having data inputs respectively receiving said second and third phase-shifted signals and clock inputs receiving the respective results of the comparisons performed by said logic gates; and
    a third flip-flop for delivering said value representative of the desired state of said at least one switch, the third flip-flop having a clock input coupled to an output of the second flip-flop and a data input coupled to an output of the third flip-flop.

12. System for controlling at least one switch comprising:
    a transmitter module for delivering, from a first square pulse signal representative of the desired state of said switch and having cycles repeated at a switching frequency, second square pulse signals all having a same frequency, greater than the switching frequency, said second signals having with respect to one another at least one phase shift having a different value according to the state of the first signal;
    a control circuit according to claim 8; and
    capacitive elements of transmission of said second signals to said control circuit in the form of said phase-shifted signals.

13. Device comprising a system according to claim 12 and said at least one switch.

14. Device according to claim 13, wherein said at least one switch is of HEMT type.

15. Device according to claim 14, wherein said at least one switch is with GaN.

16. Monolithic device comprising a device according to claim 13.

17. Switched-mode converter comprising one or a plurality of devices according to claim 13.

18. Switched-mode converter comprising one or a plurality of systems according to claim 12.

19. Monolithic device comprising a circuit according to claim 8.

* * * * *